(12) United States Patent
Kim et al.

(10) Patent No.: US 8,174,835 B2
(45) Date of Patent: *May 8, 2012

(54) HOT SWAPPABLE COMPUTER CARD CARRIER

(75) Inventors: Daehwan Kim, Sunnyvale, CA (US); Kiron Malwankar, Saratoga, CA (US)

(73) Assignee: Fusion-io, Inc., Salt Lake City, UT (US)

( * ) Notice: Subject to any disclaimer, the term of this patent is extended or adjusted under 35 U.S.C. 154(b) by 438 days.

This patent is subject to a terminal disclaimer.

(21) Appl. No.: 12/416,895

(22) Filed: Apr. 1, 2009

(65) Prior Publication Data

US 2010/0254096 A1 Oct. 7, 2010

(51) Int. Cl.
- *H05K 1/14* (2006.01)
- *H05K 7/16* (2006.01)
- *H05K 5/00* (2006.01)
- *G06F 1/16* (2006.01)

(52) U.S. Cl. ............... 361/737; 361/679.31; 361/679.32; 361/727; 361/756

(58) Field of Classification Search ............. 361/679.31, 361/679.32, 756, 727, 737, 679.33–679.4, 361/724–726

See application file for complete search history.

(56) References Cited

U.S. PATENT DOCUMENTS

| | | | |
|---|---|---|---|
| 5,611,057 A * | 3/1997 | Pecone et al. | 710/301 |
| 6,736,678 B2 * | 5/2004 | Yao | 439/638 |
| 6,738,261 B2 * | 5/2004 | Vier et al. | 361/740 |
| 6,775,791 B2 * | 8/2004 | McAfee | 714/6.1 |
| 7,009,848 B2 * | 3/2006 | Ruckerbauer et al. | 361/785 |
| 2002/0081890 A1 * | 6/2002 | Obermaier | 439/377 |

* cited by examiner

*Primary Examiner* — Jayprakash N Gandhi
*Assistant Examiner* — Nidhi Desai

(57) ABSTRACT

Embodiments are described including a device comprising a carrier frame. The device includes a first connector on a first side of the carrier frame, and the first connector connects to a host system when the carrier frame is inserted into the host system. The device includes a second connector on a second side of the carrier frame, where the second side of the carrier frame is perpendicular to the first side. The second connector electrically couples to the first connector and connects to an input/output (I/O) adapter card inserted into a third side of the carrier frame, where the third side perpendicular to the first side. Consequently, the device has a flat structure that receives an adapter card and reorients the electrical connection of the adapter card. The device includes external visual status indicators and a switch for hot-swapping of the adapter card carrier in a running host system.

15 Claims, 11 Drawing Sheets

HOT SWAPPABLE COMPUTER CARD CARRIER

TECHNICAL FIELD

The present invention relates generally to electronic computer cards and, more particularly, to PCI Express (PCIe) I/O adapter cards and a card carrier adapted to receive PCIe cards in a 1 U system chassis.

BACKGROUND

Data processing systems such as servers often include add-on adapter cards accessible from the back of the rack. These adapter cards, also referred to as input/output (I/O) adapter cards or I/O cards, are typically provided with standardized physical dimensions. These adapter cards may be communications adapter cards such as Fibre Channel adapter cards, Gigabit Ethernet (GbE) adapter cards, InfiniBand adapter cards, or graphic and video processing cards, to name a few. These adapter cards are often required to be serviced, replaced, or upgraded, meaning that they need to be easy to access and easy to remove and replace.

I/O adapter cards such as PCIe card are generally provided in one or two sizes, i.e., a full-sized or half-sized card corresponding to a length of 12.283" and 6.6", respectively. In a typical blade server environment, most hardware equipment is installed within 19-inch rack cabinets for easy installation and maintenance, with the 19-inch rack cabinet so referred to because the width of the cabinet that houses the hardware is 19 inches. The common computer rack can hold equipment with a total height of 42 U, with 1 U being 1.75" (44.45 mm) in height. As consequence, the smallest equipment is housed in a 1 U chassis, which is also known as a "pizza box." The 1 U rack-mounted chassis is so called not only because of its flat structure, but also because of the way its top cover is removed.

As computer power increases, the need for I/O capability also increases accordingly. Unfortunately, the confined space of the 1 U chassis severely limits the addition of more I/O adapter cards. In particular, the height constraints placed on the 1 U chassis requires that the cards can only be placed horizontally in a typical chassis because the height of the card (including the metal bracket) is generally greater than the interior height of the chassis. While the horizontal card placement allows the I/O cards to be placed in the chassis, it is a non-optimal configuration considering the accessibility requirements of the 1 U chassis in the field. Consequently, the horizontal I/O card configuration does not allow for hot-swap capability, and requires the following procedure for removing a card: power down the server blade; remove server blade from rack cabinet; remove the top cover of server blade; remove I/O card horizontally from connector.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

DETAILED DESCRIPTION

Figure 1:
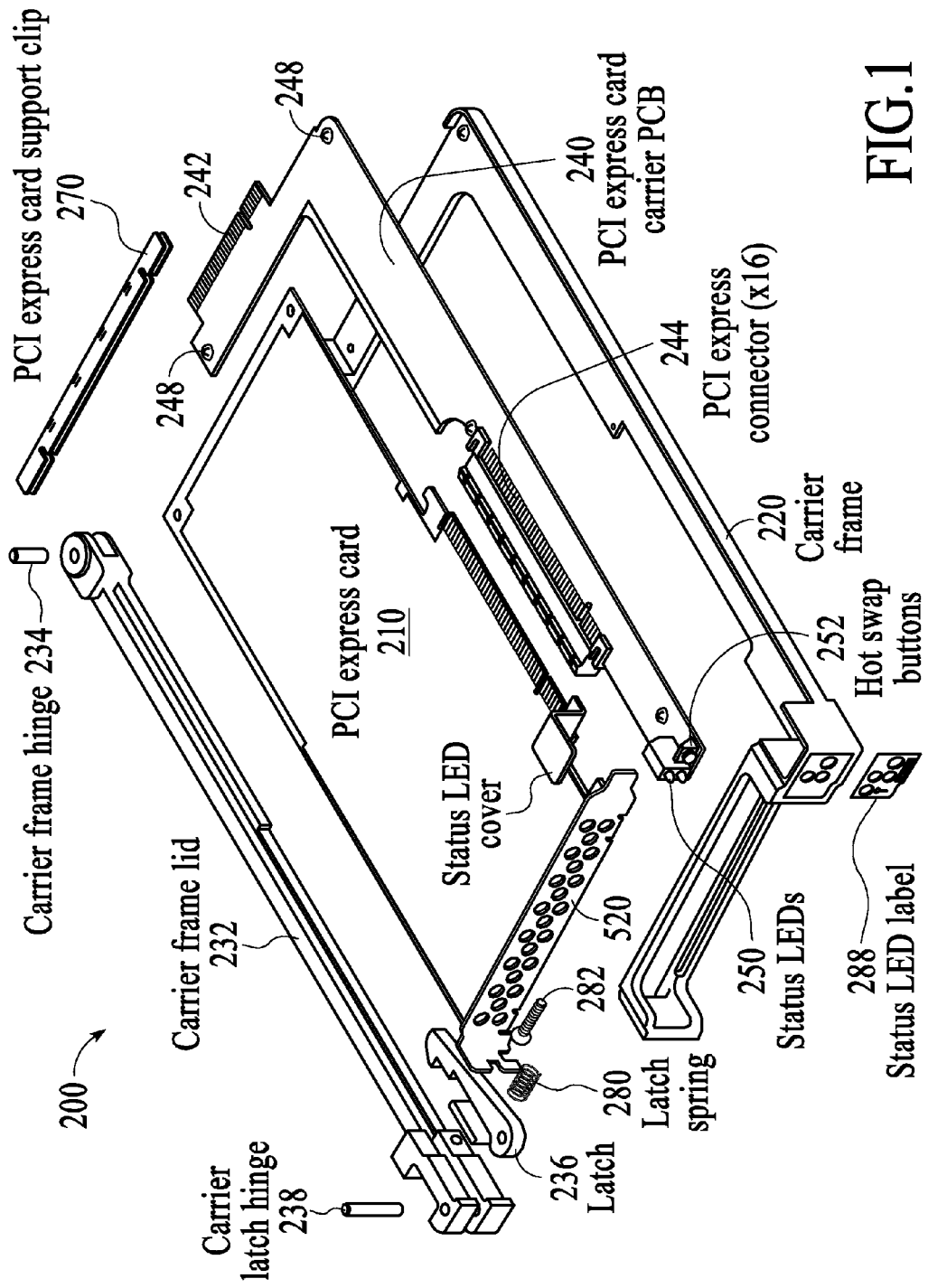
FIG. 1 is an exploded view of the card carrier including an adapter card, under an embodiment.

Embodiments described herein provide a method and apparatus to increase the number of installed I/O adapter cards in a 1 U computing system. An example embodiment comprises an apparatus for providing electrical and mechanical coupling between an I/O adapter card and a host system. The apparatus comprises a support bracket and a circuit board (e.g., interconnect printed circuit board (PCB)) mounted to the support bracket. The interconnect PCB includes an edge connector having a plurality of conductive fingers mounted on one outer side of the PCB and a connector having a rectangular shape with a receptacle side having a plurality of conductive contacts mounted on the other side of the PCB. Both the connector edge and the connector are flatly disposed on the PCB and are perpendicularly positioned relative to each other. The connector and the connector edge are electrically coupled through conductive traces formed on a surface of the PCB. A portion of the I/O adapter card is inserted to the connector in a first direction that is parallel to the edge connector. The edge connector is inserted to the host system in a second direction, which is perpendicular to the connector, hence the apparatus re-orients the insertion direction of the I/O adapter card. Additionally, the apparatus further comprises visual indicators adapted for showing the power and operational status of the I/O adapter card and a switch adapted for hot-swapping the I/O adapter card without shutting down the host system.

Another exemplary embodiment comprises a system for electrically coupling a plurality of card carriers to a host system. The system comprises a carrier housing adapted to retain card carriers in a computing system with space constraints. The card carrier is adapted to receive an I/O adapter card and reorient its insertion direction. The carrier housing can securely retain two card carriers that are substantially horizontally positioned over one other. The carrier housing comprises angled flanges at the lower sidewalls designed as mechanical coupling areas for securing the carrier housing to a system chassis. The mechanical coupling of the carrier housing to the chassis can be performed through welding or fastening using rivets and/or screws. The system further comprises a riser board that includes connectors on both sides for electrically coupling the plurality of card carriers to the host system.

Yet another embodiment comprises a method for installing I/O adapter cards within a system chassis having a computing motherboard. The method comprises providing a card carrier having a printed circuit board (PCB) flatly mounted on a carrier frame. The PCB includes a connector mounted along one of its side for receiving an I/O adapter card and an edge connector disposed perpendicularly to the connector. The method further comprises providing a carrier housing that includes a front side, a back side and two parallel sidewalls. The sidewalls contain an angled flange at the bottom for securing the carrier housing to a chassis. The sidewalls also contain a guiding mechanism for easing the insertion of the card carrier into the carrier housing. Furthermore, the method comprises providing a riser board mounted vertically to the chassis. The side facing exteriorly toward the carrier housing includes one or more connectors for receiving the card carriers; and the side facing interiorly toward the computing motherboard may have a connector for receiving a portion of the motherboard. Connectors on both sides of the riser board are electrically coupled. Additionally, the method further comprises installing the I/O adapter card into the card carrier that includes a retention arm for securing the I/O adapter card. Moreover, the method further comprises inserting the card carrier with the installed and secured I/O adapter card into the carrier housing the guiding mechanism.

The card carrier of an embodiment enables the installation of multiple PCIe I/O adapter cards within a 1 U, 4 U and/or 5 U computing system. For example, the card carrier configuration allows for installation of four (4) PCIe modules into a 1 U system. The card carrier comprises a carrier frame configured as a staple-shaped support bracket for receiving and securing an interconnect printed circuit board (PCB). An edge connector having a plurality of conductive fingers is mounted to the outer bottom side of the PCB, and a rectangular-shaped connector is mounted along the inner vertical side of the PCB. The edge connector and the rectangular-shaped connector are flatly positioned on the PCB and are oriented perpendicular to each other. The rectangular-shaped connector contains a receptacle having one or more terminal posts lining the inner wall of the receptacle. The receptacle is adapted to receive a portion of a PCIe I/O adapter card. The interconnect PCB serves to reorient the insertion direction of the PCIe I/O adapter card. That is, the PCIe I/O adapter card is moved along an insertion direction which is perpendicular to the insertion direction of the edge connector. The electrical contacts of the receptacle may be coupled to the edge connector through conductive traces that are disposed on the surface and/or within layers of the interconnect PCB. In one embodiment, the edge connector may be horizontally directly coupled to a system motherboard having a right-angled connector. In another embodiment, the edge connector may be indirectly coupled to the motherboard through a receiving connector mounted on a mid-plane riser board.

In the following description, numerous specific details are introduced to provide a thorough understanding of, and enabling description for, embodiments of the present invention. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Embodiments of the method and apparatus to increase the number of installed I/O adapter cards described herein is provided in the context of PCI-Express cards (PCIe cards). Thus, by way of example, the metal bracket, the connectors, and the add-in adapter cards described in the specification are in compliance with the PCI-Express Card Electromechanical Specification and Base standardized by PCI-SIG. The embodiments described here are not, however, limited to use only with PCIe cards and may be used with computer cards, adapter cards or I/O cards of other types, configurations and/or combinations.

Figure 2:
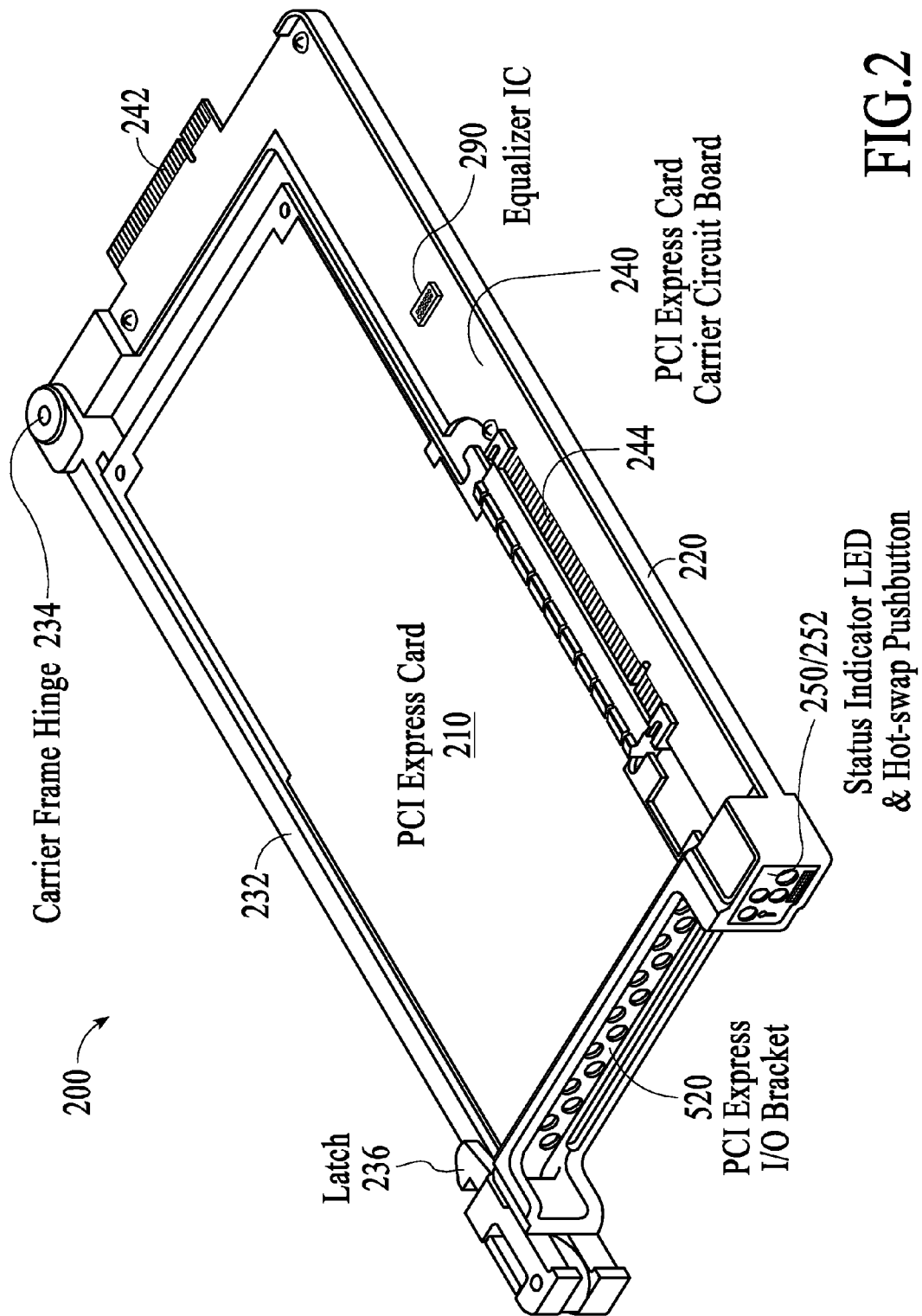
FIG. 2 is a perspective view of the assembly or ensemble of the adapter card and the card carrier, under an embodiment.

FIG. 1 is an exploded view of the card carrier 200 including a PCIe card 210, under an embodiment. FIG. 2 is a perspective view of the assembly 200 or ensemble of the adapter card and the card carrier, under an embodiment. The PCIe card 210 is shown to be at the center of an exploded card carrier 200. The card carrier 200 comprises a carrier frame 220. In an embodiment, the carrier frame 220 can be formed as one piece using metal or plastic injection molding. A circuit board comprising a PCB 240 is mounted to the carrier frame 220, but the embodiment is not so limited. In an embodiment, an adhesive composition such as high-performance glue may be used for the attachment of the PCB 240 to the carrier frame 220. In another embodiment, the attachment of the PCB 240 to the carrier frame 220 can be secured with fasteners 248. The fasteners 248 may be preferably screws.

The PCB 240 of an embodiment includes an L-shaped structure. A connector 244 is mounted along the inner side of the vertical line of the L-shaped PCB. The connector 244 on the PCB can be a right-angled connector that is mounted to the PCB through through-holes or a straddle connector that is mounted on the PCB by straddling both sides of the PCB. The connector includes a slot having a plurality of conductive contacts lining the inner edge of both slot walls. The slot is configured to receive an edge connector 212 of PCIe card 210. In one embodiment, connector 244 is a right-angled connector adapted to perform a x16 PCI Express link. However, the PCIe x16 slot configuration of the connector 244 can be other types of PCIe slot configuration (e.g., x2, x4, x8, x32).

The PCB 240 also includes an edge connector 242 positioned along the outer side of the horizontal line of the L-shaped structure. The edge connector 242 includes a plurality of conductive fingers disposed on both sides having electrical and physical characteristics compliant with the PCI-Express Base Specification Revision 2.0 standardized by PCI-SIG.

As connector 244 and edge connector 242 are disposed on the respective vertical line and horizontal line of the L-shaped PCB 240, they are positioned perpendicular relative to each other. In one embodiment, the conductive contacts of the connector 244 can be directly electrically coupled to the conductive fingers of the edge 242 via conductive traces disposed on a surface (component layer or solder layer) of PCB 240. In another embodiment, the traces can be disposed on the surface and within PCB 240, which may have one or more insulation layers and conductive layers.

The PCB 240 may comprise an FR-4 material, but is not so limited. The traces may be laid out in a manner to ensure signal integrity, minimize electromagnetic interference (EMI), prevent cross talk and reduce signal skew. The layout guidelines of conductive traces for high data rates are known to one of skill in the art. For example, IEEE 802.3ak provides guidelines of the trace layout for 10 Gbps Ethernet using an FR-4 type material. PCI Express specifies a maximum trace length of 20 inches, which dimension accommodates the embodiments described herein. However, for any reasons that signal integrity cannot be achieved in some embodiments of the present invention, a signal conditioner can be included to recondition the signals as they are transferred to the host system. The signal conditioner of an embodiment, also referred to as a conditioner, is a conditioner integrated circuit (IC) 246, but is not so limited. The conditioner IC 246 can be positioned in the datapath or coupling between the PCIe adapter card and the host system, and the conditioner IC 246 may be based on equalization and de-emphasis techniques.

The equalization and de-emphasis techniques basically reverse the attenuation caused by the high data rate across a high-impedance PCB, thereby compensating for signal degradation. The conditioner IC 246 may be required when signals must cross multiple connectors or long backplanes.

Additionally, PCB 240, and thus the card carrier, comprises visual indicators 250 and a service button switch 252. The visual indicators 250 and service button switch 252 may be mounted on the top end of the L-structure of PCB 240, adjacent to each other and facing away from the host system. This configuration of the visual indicators 250 and service button switch 252 places them at the front panel for ease of access. Visual indicators 250 can be light emitting diodes (LEDs) for indicating the power and operation status of the PCIe card 210, but the embodiment is not so limited. In one embodiment, service button switch 252 can be a momentary-contact push button switch. The number of LEDs, the number of service buttons, and the cited colors are merely specific examples of some embodiments of the card carrier and should not be limiting.

In an embodiment, visual indicators 250 comprise two bi-color LEDs. A bi-color LED is a single LED that can change color of the illuminating light, for example, from green to yellow and back, or from green to red and back. A first LED can be used as indicator for the power status; the color of the illuminating light is green when the power supplies of the adapter card are within normal operating ranges, and turns yellow when one or more of the power supplies are outside the normal operating ranges signaling to a human operator than services may be required. A second LED can be used as a visual feedback to the operator. The emitting light of the second LED is green in normal operation and turns to a blinking yellow after the operator pushes the service button switch 252 to signal to the host system or a downstream port of a PCIe switch for an immediate hot-swap event. The second yellow LED stops blinking after a predetermined time period, e.g., five seconds, to indicate that the adapter card slot is now safe to be hot added and hot removed from the host system or from the downstream port. During the yellow blinking period of the second LED, the operator can exit or cancel the hot-plug or hot-swap event by pressing service button switch 252 a second time. In this case, the blinking will stop and the second LED will resume its green emitting light.

In an alternative embodiment, visual indicators 250 comprise three bi-color visual indicators. The first visual indicator and the second visual indicator may operate in a similar manner described above. The third visual indicator may be a uni-color or bi-color LED that indicates the physical layer and/or data link layer activities. For example, the third LED is blinking green signaling that transaction packets are being successfully received. The blinking green light turns yellow when transaction packets are being erroneously received in the physical, data link, or transaction layer.

The carrier frame 220 can be a staple-shaped structure having a major portion of the staple configured to support the L-shaped PCB 240. The remaining portion of the staple-shaped structure contains an elevated wall having a protrusion at each end. One protrusion end of the elevated wall contains a number of openings 226 configured to provide access to visual indicators 250 and service button switch 252. Another protrusion end 228 of the elevated wall may be used as an arrest for the metal bracket 214 of the PCIe card 210. Additionally, the elevated wall includes an aperture 222 sufficiently large to provide access to the metal bracket 214 of the PCIe card 210. The metal bracket 214 contains in turn cutouts configured to provide access to I/O connectors (not shown) mounted on the PCIe card 210. The PCIe card can be further secured in place by a retention mechanism 232 that is coupled to the carrier frame 220 through a carrier frame hinge 234. The retention mechanism 232 comprises a retention latch mechanism for holding the PCIe card 210 in place once its edge connector has fully established electrical contact with connector 244. The retention latch mechanism includes a latch 236, a latch spring 280, and a screw 282, but is not so limited. The components of the retention latch mechanism are referred to herein collectively as the latch 236.

A status LED and service switch cover 224 may be provided for mechanical protection of the visual indicators 250 and the service button switch 252. The cover 224 may be attached to the PCB 240 and the carrier frame 220 using one or more fasteners 248. In one embodiment of the present invention, labels for the openings 226 may be directly put on the flat surface of the elevated wall using spray painting, powder printing, or stencil printing. In another embodiment of the present invention, an external label 288 having matching cutouts with the openings 226 may be put over the openings.

Figure 3:
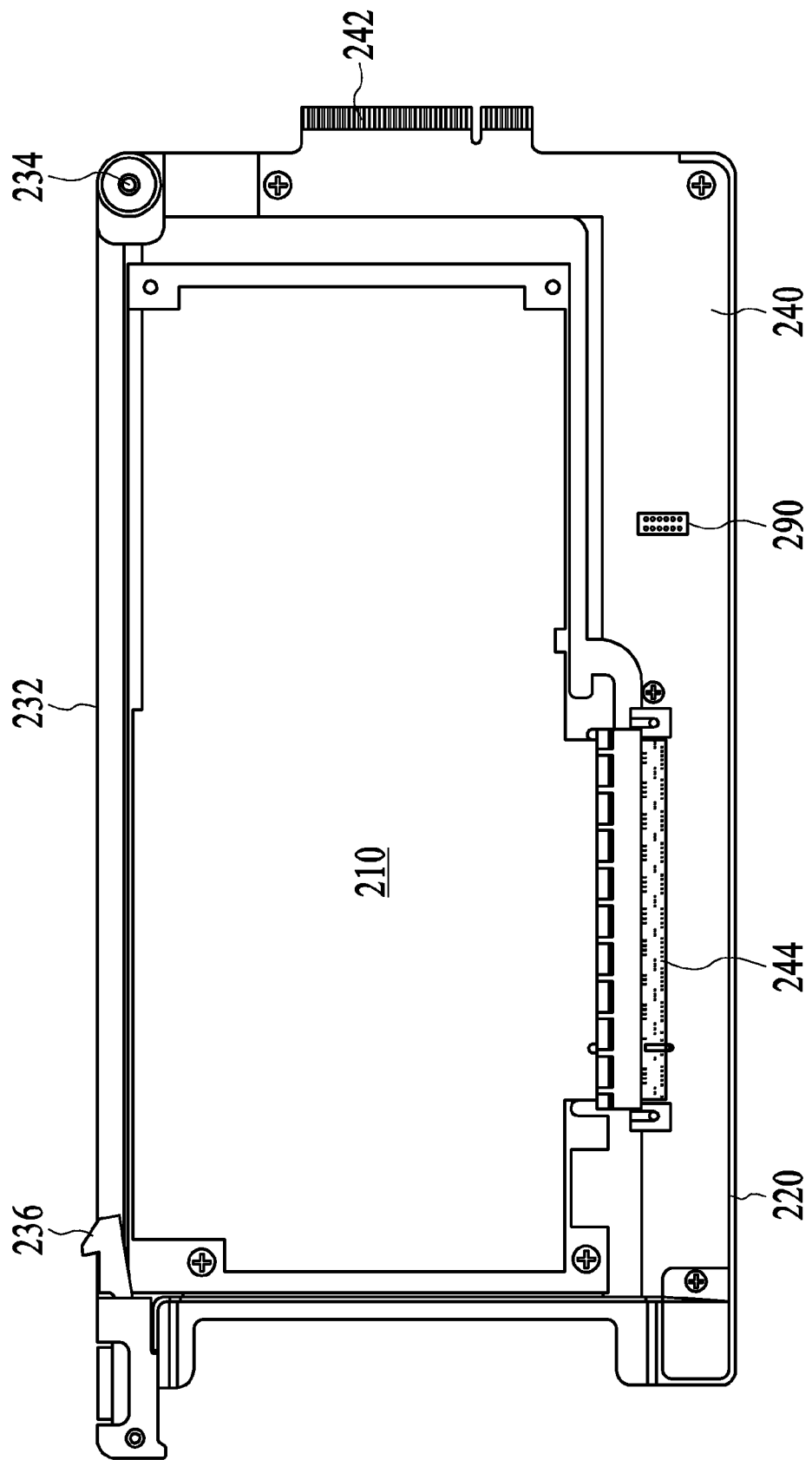
FIG. 3 is a top view of the assembly comprising the adapter card and the card carrier, under an embodiment.

FIG. 3 is a top view of the assembly comprising the PCIe card 210 and the card carrier 200, under an embodiment. The PCIe card 210 is inserted in the card carrier 200. The metal bracket 214 of PCIe card 210 rests on the protrusion end 228 of the carrier frame 220. The retention arm 232 is closed along the outer side of the PCB 210.

Figure 4:
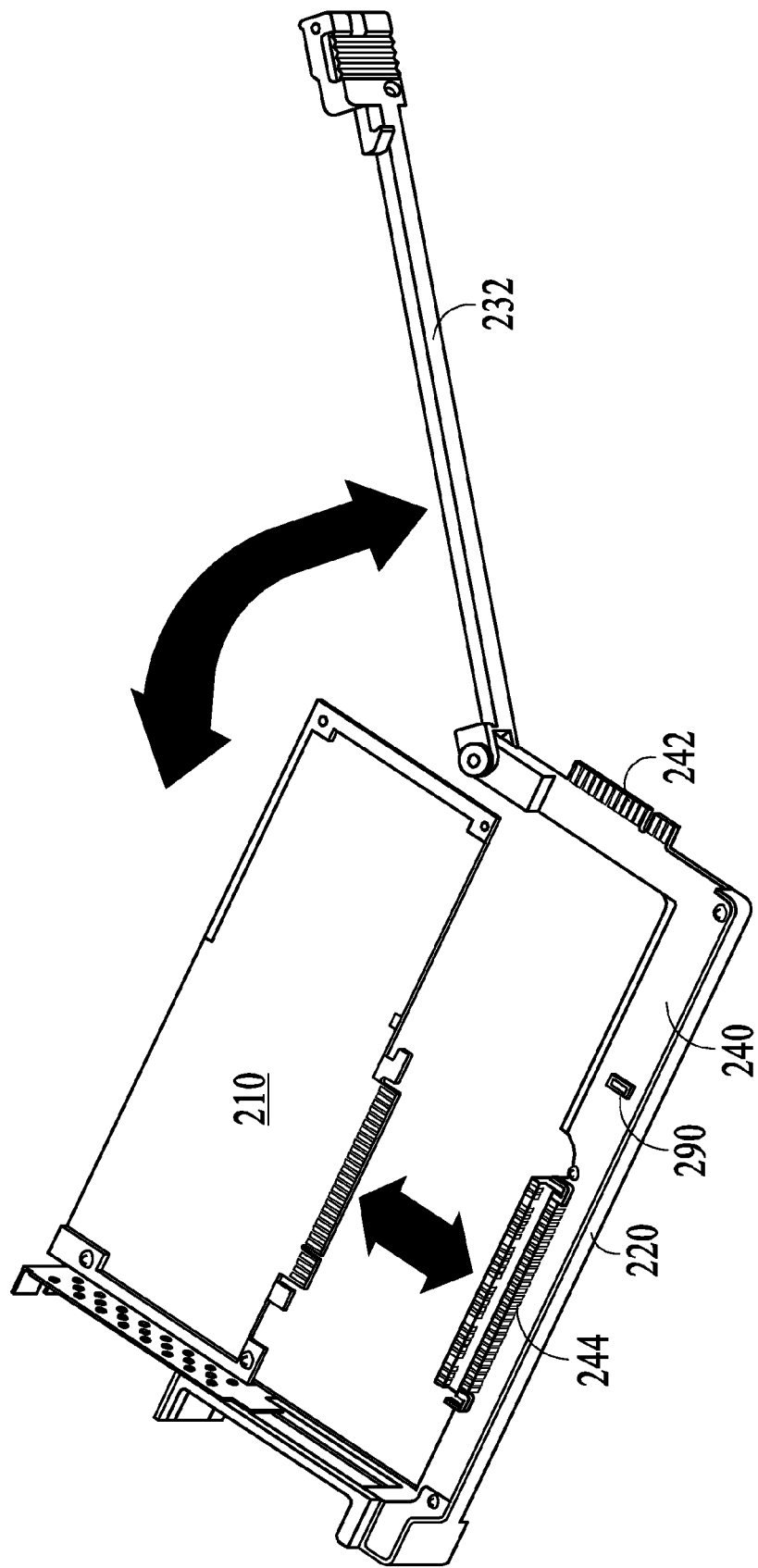
FIG. 4 shows insertion of the adapter card in the fully assembled card carrier and the securing of the adapter card with the retention mechanism, under an embodiment.

FIG. 4 shows insertion of the adapter card 210 in the fully assembled card carrier 200 and the securing of the adapter card with the retention mechanism 232, under an embodiment. The edge connector 212 of the PCIe card 210 is inserted into the connector 244 located on the PCB 240. PCB 240 is mounted to the carrier frame 220 using fasteners 248. The conditioner IC 246 is mounted on the surface of the PCB 240 and positioned between the connector 244 and edge connector 242. The conditioner IC 246 ensures that signals transmitting from the PCIe card 210 will be delivered to the host system with adequate eye-diagram margins to conform to the PCI Express standard. The retention mechanism or arm 232 retains the PCIe card 210 in the inserted position. The visual indicators and the service button switch are hidden under the cover 224, which is mechanically connected to the PCB 240 and the card carrier 220 using fastener 248.

Figure 5:
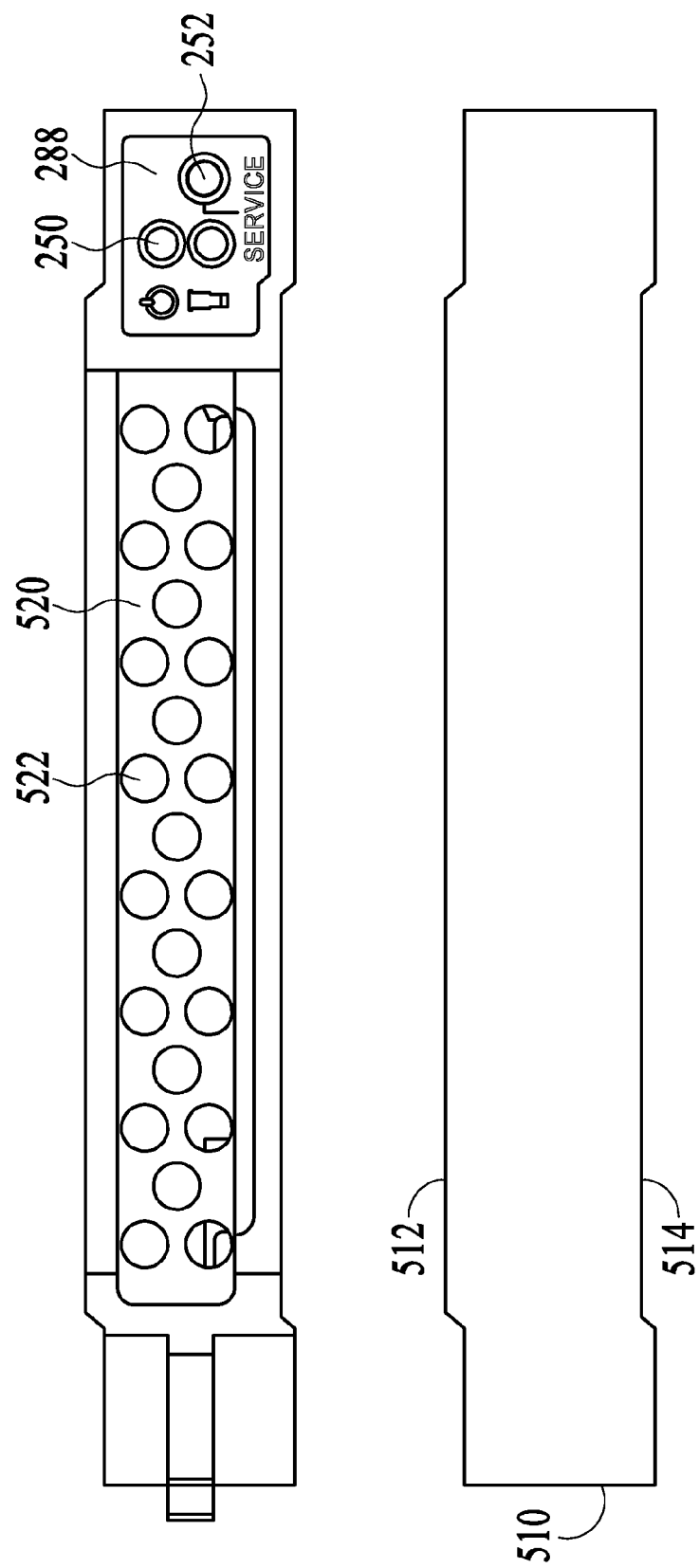
FIG. 5 shows a front side or external view of the card carrier including an adapter card, under an embodiment.

FIG. 5 shows a front side or external view of the card carrier including a PCIe adapter card, under an embodiment. The contour 510 of the front side of the card carrier has a protrusion 512 at the top and a recess 514 at the bottom. The opening 222 configuration of the carrier frame 220 as described above is sufficient to provide access to the bracket of PCIe card. The bracket 520 generally has cutouts (shown as round circles 522) adapted to accommodate I/O networking connectors mounted on the PCIe card. Label 288 is shown on the right having three round cutouts. The round cutout 252 on the right is for the button switch and is labeled "SERVICE". The two round cutouts 250 in the middle are for the visual indicator LEDs. Adjacent to the two round cutouts are the corresponding labels for power status and for hot-swap service (with the label "!").

The card carrier has been described in detail above. The card carrier provides advantages of reorienting the insertion and removal direction of a PCIe card, so that the PCIe cards can be added or removed from a host system from the access panel (e.g., back panel, front panel, etc.) without having to shut down the system power, physically remove the chassis and remove the cover. In order to install more than two stacked card carriers in a 1 U chassis, for example, a special carrier housing is required. Since the card carriers are not directly connected to the motherboard, additional connectors are required.

Figure 6:
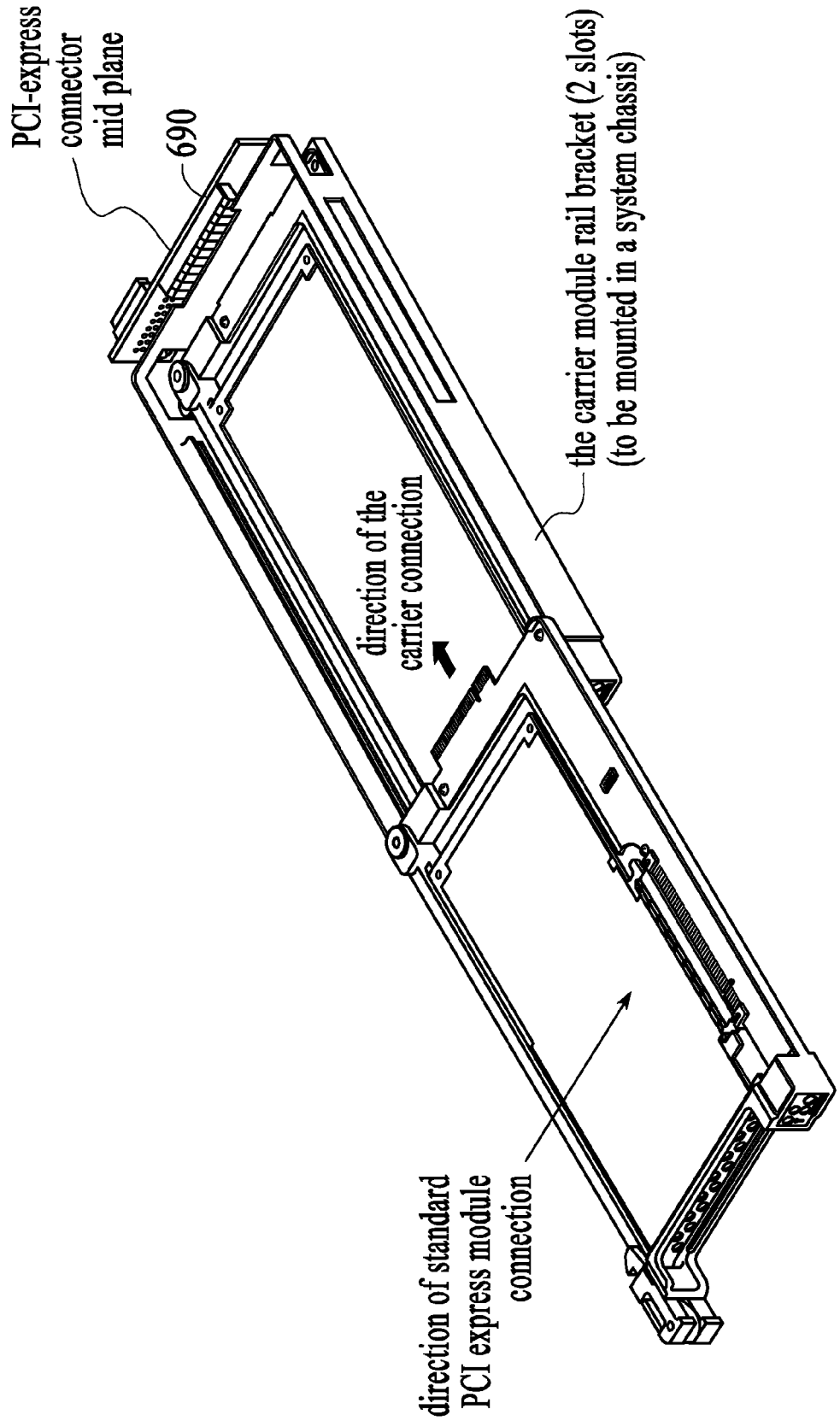
FIG. 6 shows a carrier housing for retaining two card carriers, under an embodiment.

FIG. 6 shows a carrier housing 690 for retaining two card carriers 200, under an embodiment. The card carriers 200 are described above. The carrier housing of an embodiment is a rectangular-shaped box having a front side, a back side, and two parallel sidewalls. The front side includes an aperture sufficiently large to accept one or more card carriers. Each inner surface of the sidewalls may include one or more guide rails running in parallel from the front side to the back side to mechanically support the card carriers. In an embodiment, the guide rails have a U-shaped structure, but are not so limited. In another embodiment, the guide rails are brackets that are directly formed from the sidewalls.

As described herein, the carrier housing including the card carriers contained within, can be inserted or installed in a processing system. In particular, one or more carrier housings are inserted or installed into a system chassis of a host processing system. The system chassis can receive the carrier housings, and thus the adapter cards, in either of a horizontal configuration or a vertical configuration, both of which are described in turn below.

Figure 7:
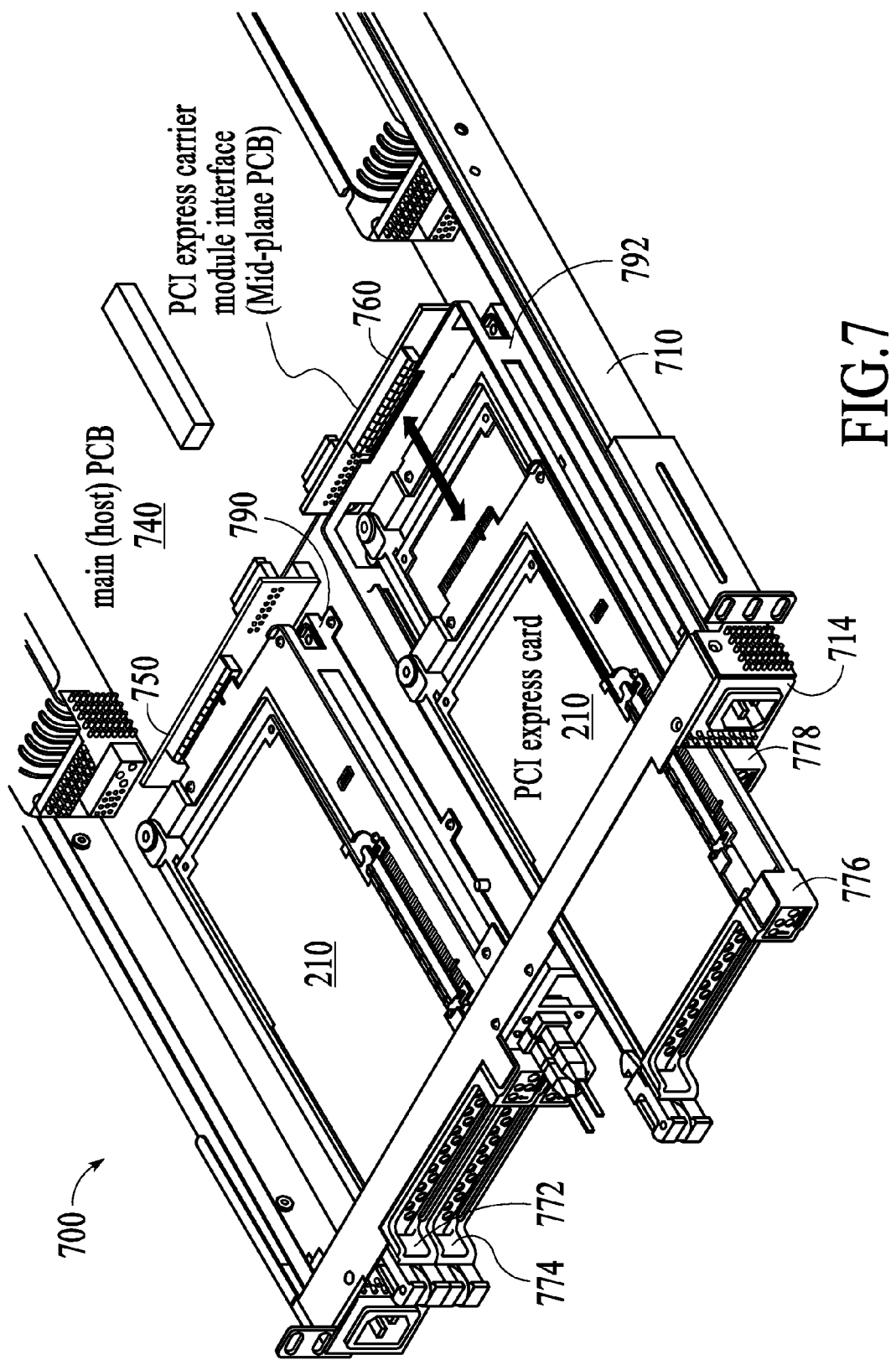
FIG. 7 shows a perspective rear view of a system chassis with two installed carrier housings, under an embodiment.

FIG. 7 shows a perspective rear view of a system chassis 710 with two installed carrier housings 790 and 792, under an embodiment. This system chassis 710 is an example of a horizontal configuration, when referenced relative to a bottom of the system chassis 710, but the embodiment is not limited to only this configuration. The computing system 700 comprises a chassis 710 having a front enclosure (not shown) and a rear enclosure 714, a motherboard 740 (partially shown), four card carriers 772, 774, 776 and 778 that are retained in the two carrier housings 790 and 792. In this example embodiment the carrier housings 790 and 792 are removeably connected to the host system via openings or access regions in the rear enclosure 714, but the embodiment is not limited to access regions in the rear enclosure 714. The carrier housings and card carriers are each as describe above. Alternative embodiments can have any number of carrier housings installed in a system chassis and, as such, are not limited to two carrier housings containing two card carriers per housing.

Figure 8:
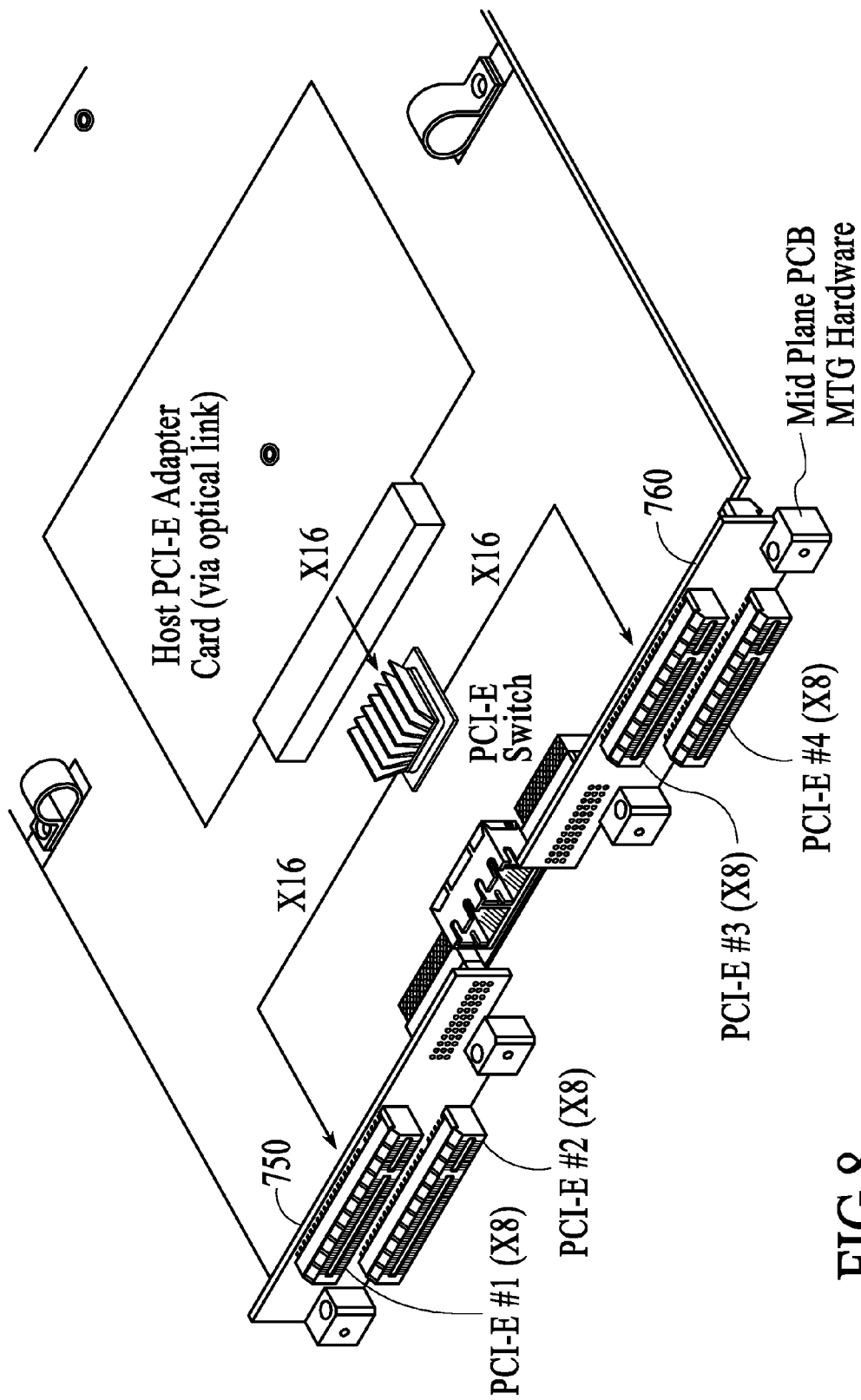
FIG. 8 shows the two mid-plane riser boards, under an embodiment.

The system of an embodiment includes a number of riser boards that each includes some number of connectors for connecting to card carriers. As one example, the system 700 includes two mid-plane riser boards 750 and 760 that electrically couple the PCIe cards to the motherboard 740. FIG. 8 shows the two mid-plane riser boards 750 and 760, under an embodiment. Each mid-plane riser board is located or positioned in a middle region of a system chassis and includes two PCIe connectors that connect to the card carriers, as described above. In this example, a first mid-plane riser board includes two PCIe connectors (e.g., PCI-E #1, PCI-E #2), and a second mid-plane riser board includes two PCIe connectors (e.g., PCI-E #3, PCI-E #4), but the embodiment is not so limited. The mid-plane riser boards of this example receive the card carriers on a first side, and couple or connect to the motherboard 740 of the host system on a second side opposite the first side; in an alternative embodiment, however, the mid-plane riser boards can receive the card carriers on a first side, and couple or connect to the motherboard of the host system on the first side. In an embodiment, the mid-plane riser boards 750 and 760 are mounted to the chassis 710 using fasteners such as screws. The card carriers 772, 774, 776 and 778 are not fully inserted in the chassis 710, and their covers protrude outside of the rear enclosure 714. This example embodiment provides for relatively easy insertion and removal of card carriers, optical indicators that are more visible, and a hot-swap button switch that is easily accessed.

As another example, the system includes some number of back-plane riser boards (shown and described with reference to FIGS. 9, 10, and 11 below, in a vertical embodiment) that electrically couple the PCIe cards to the motherboard. Each back-plane riser board is located or positioned in an end region of a system chassis and is mounted to the system chassis; the end region of the system chassis is a region of the chassis opposite the access region that receives the carrier housing. Each back-plane riser board includes some number of PCIe connectors that connect to the card carriers, as described above. For example, a first back-plane riser board can include two PCIe connectors, and a second back-plane riser board can include two PCIe connectors. The back-plane riser boards can receive the card carriers on a first side, and couple or connect to the motherboard of the host system on a second side opposite the first side. In an alternative embodiment, the back-plane riser boards can receive the card carriers on a first side, and couple or connect to the motherboard of the host system on the first side.

Figure 9:
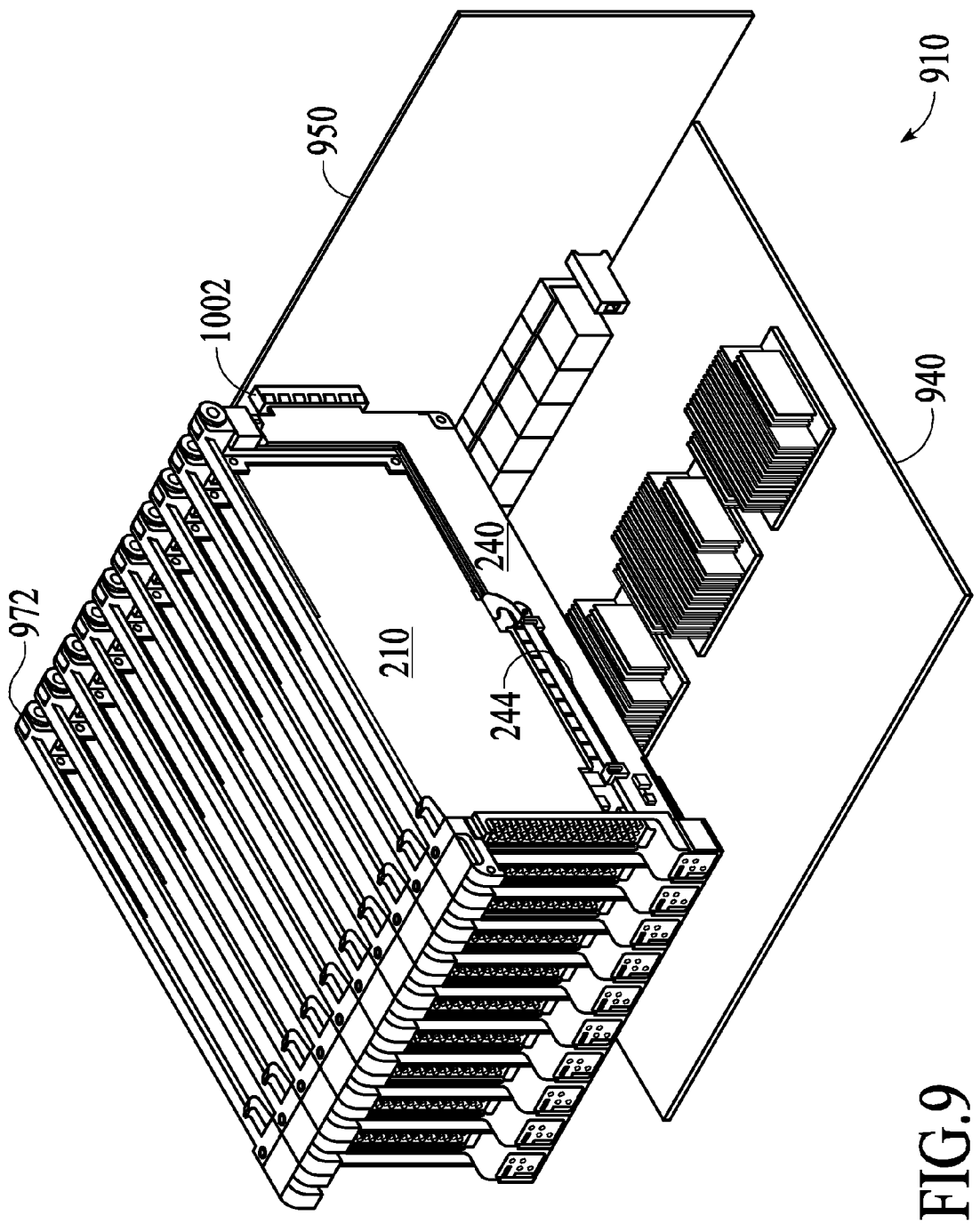
FIG. 9 is a perspective view of a partial system chassis with ten card carriers, under an embodiment.
Figure 10:
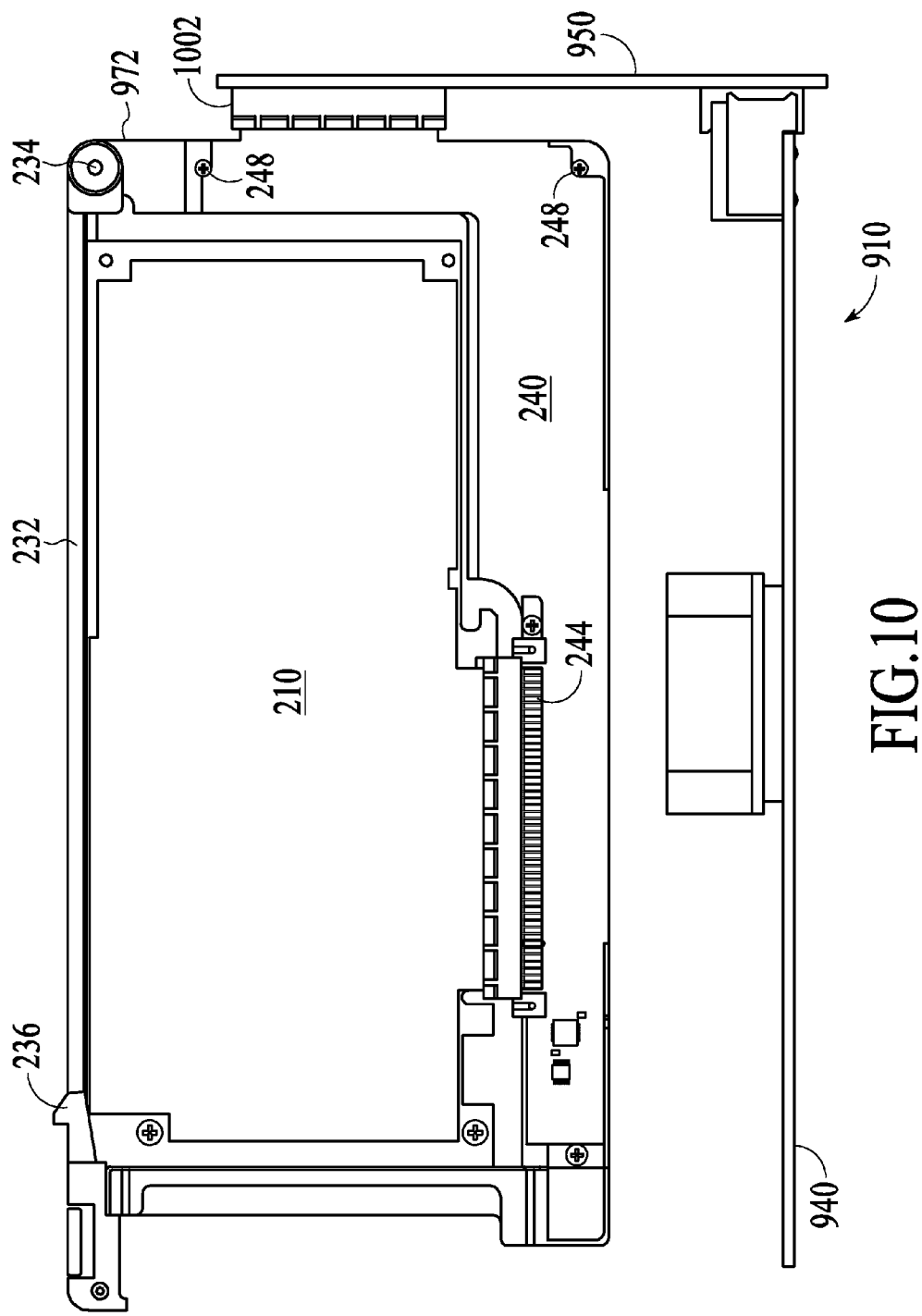
FIG. 10 is a side view of the system chassis with installed card carriers, under an embodiment.

As described above, the system chassis can receive the carrier housings, and thus the adapter cards, in a vertical configuration, where the vertical configuration is referenced relative to a bottom of the system chassis. FIG. 9 is a perspective view of a partial system chassis 910 with ten card carriers 972, under an embodiment. This example embodiment includes the carrier housings described above, but the carrier housings are not shown for purposes of clarity. FIG. 10 is a side view of the system chassis 910 with installed card carriers 972, under an embodiment. The computing system comprises a chassis 910 (partially shown), a riser board 950, a motherboard 940, and ten (10) card carriers 972 housed or retained in five carrier housings (not shown). The motherboard 940 includes a number of straight connectors 1002 that couple or connect to the card carriers 972, and thus the adapter cards, as described above. The carrier housings and card carriers 972 are each as describe above. Alternative embodiments can have any number of carrier housings installed in a system chassis, with each carrier housing containing any number of card carriers, and, as such, are not limited to two carrier housings containing two card carriers per housing.

Figure 11:
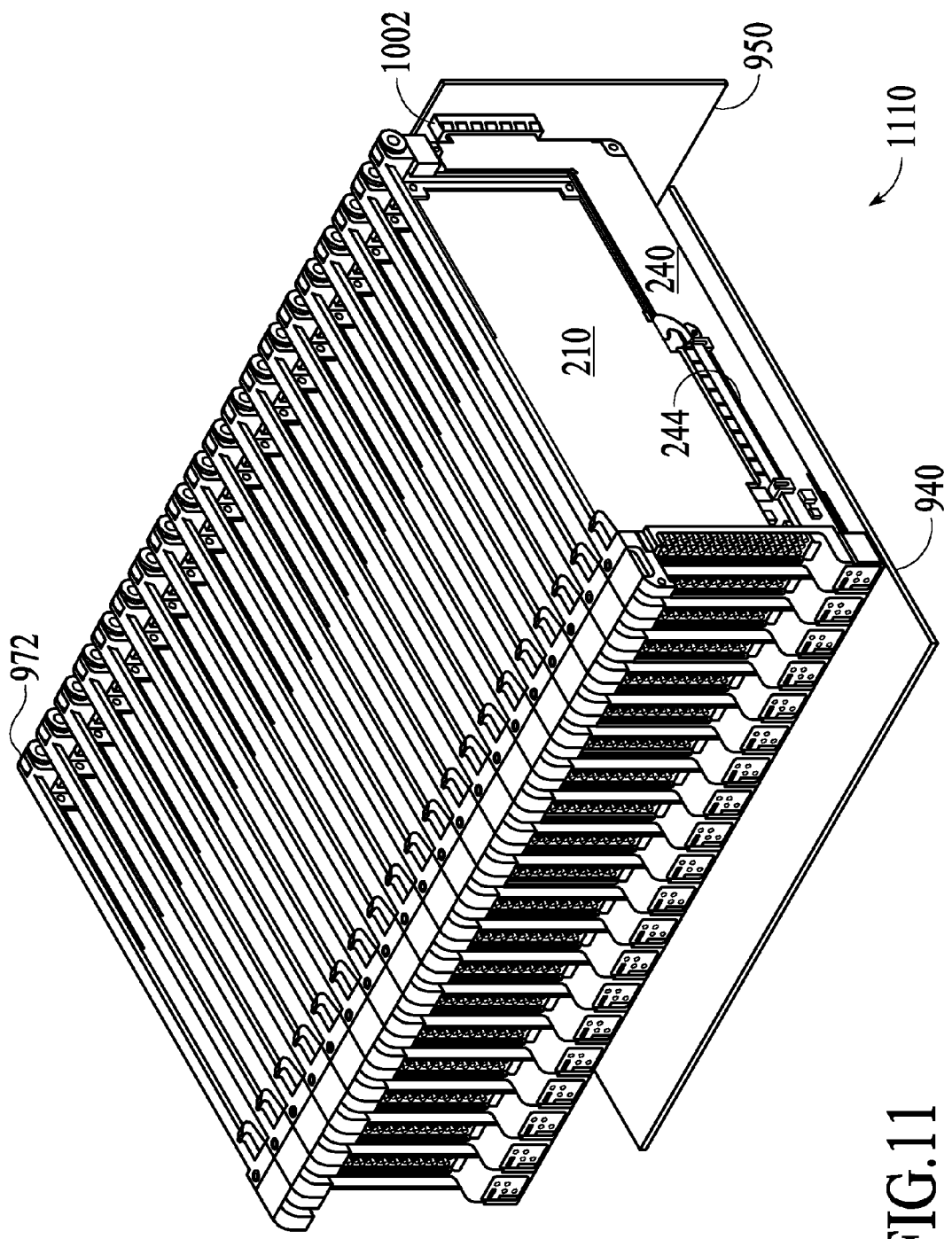
FIG. 11 is a perspective view of a partial system chassis with twenty installed card carriers, under an embodiment.

FIG. 11 is a perspective view of a partial system chassis 1110 with twenty installed card carriers 972, under an embodiment. The computing system comprises a chassis 1110 (partially shown), a riser board 950, a motherboard 940, and twenty (20) card carriers 972 housed or retained in the ten carrier housings (not shown). The carrier housings and card carriers 972 are each as describe above. Alternative embodiments can have any number of carrier housings installed in a system chassis and, as such, are not limited to two carrier housings containing two card carriers per housing.

Regardless of the number of carrier housings and card carriers, the system includes some number of riser boards that electrically couple the PCIe cards to the motherboard. The views of this system depicted in the drawings do not limit the example to mid-plane or back-plane riser boards, and the riser board depicted represents either of a mid-plane and a back-plane riser board. Each back-plane riser board includes some number of PCIe connectors that connect to the card carriers, as described above. In this example, the riser boards receive the card carriers on a first side and couple or connect to the motherboard of the host system on the first side. In an alternative embodiment, the back-plane riser boards can receive the card carriers on a first side, and couple or connect to the motherboard of the host system on a second side opposite the first side, as described above.

The embodiments described herein include a device comprising: a carrier frame; a first connector on a first side of the carrier frame, the first connector connecting to a host system when the carrier frame is inserted into the host system; and a second connector on a second side of the carrier frame, the second side of the carrier frame perpendicular to the first side, the second connector electrically coupled to the first connector and connecting to an input/output (I/O) adapter card inserted into a third side of the carrier frame, the third side perpendicular to the first side.

The second connector of an embodiment is horizontally positioned so the I/O adapter card has a flat orientation relative to the carrier frame when the I/O adapter card is connected to the second connector.

The carrier frame of an embodiment is inserted into the host system along a first direction, the first direction toward an interior portion of the host processing system, wherein the I/O adapter card is inserted into the carrier frame along a second direction, the second direction oriented approximately normal to the first direction.

The device of an embodiment comprises a circuit board mounted to the carrier frame, wherein the first connector and the second connector are mounted to the circuit board.

The circuit board of an embodiment includes a structure comprising at least one of isolation layers and conductive layers.

The device of an embodiment comprises an ensemble module formed by the circuit board mounted on the carrier frame and the I/O adapter card secured into the carrier frame, the ensemble module being slidingly inserted and removed from the host system.

The device of an embodiment comprises a signal conditioner circuit coupled between the first connector and the second connector.

The device of an embodiment comprises a circuit board mounted to the carrier frame, wherein the signal conditioner circuit is an application-specific integrated circuit on the circuit board.

The device of an embodiment comprises at least one visual indicator configured to indicate a power state and an operational status of the I/O adapter card.

The at least one visual indicator of an embodiment faces in a direction external to the host system.

The at least one visual indicator of an embodiment is one of a uni-color light emitting diode (LED), a bi-color LED, and a tri-color LED.

The device of an embodiment comprises a circuit board mounted to the carrier frame, wherein the at least one visual indicator is carried on the circuit board.

The device of an embodiment comprises a switch adapted for hot-swapping the I/O adapter card, wherein hot-swapping comprises at least one of inserting and removing the I/O adapter card while the host system is operating.

The switch of an embodiment faces in a direction external to the host system.

The third side of the carrier frame of an embodiment is coupled to the first side with a hinge, wherein the third side is placed in an open position by rotating the third side around the hinge.

The device of an embodiment comprises a latch that secures the third side of the carrier frame in a closed position, wherein the closed position secures the I/O adapter card in the carrier frame.

The I/O adapter card of an embodiment is compliant to a standard form factor specified by PCI-SIG.

The embodiments described herein include a device comprising: a carrier frame; a circuit board connected to the carrier frame, the circuit board including a first connector mounted to a first side and configured to form an electrical coupling with a host system when the carrier frame is inserted into the host system; and a second connector mounted to a second side of the circuit board and coupled to the first connector, wherein the second side of the circuit board is perpendicular to the first side, wherein the second connector is configured to form an electrical coupling with an adapter card inserted into a third side of the carrier frame, the third side perpendicular to the first side.

The embodiments described herein include a device comprising: a carrier frame; a circuit board connected to the carrier frame, the circuit board including a first connector mounted to a first side, the first connector forming an electrical coupling between the circuit board and a host processing system when the carrier frame is inserted along a first direction into the host processing system, wherein the first direction is toward an interior portion of the host processing system; and a second connector mounted to a second side of the circuit board, the second connector coupled to the first connector via a plurality of traces of the circuit board, the second connector including a receptacle for receiving an input/output (I/O) adapter card, the second connector forming an electrical coupling between the I/O adapter card and the circuit board when the I/O adapter card is inserted along a second direction into the carrier frame, wherein the second direction is oriented approximately normal to the first direction.

The embodiments described herein include a method comprising: forming an assembly by inserting an input/output (I/O) adapter card along a first direction into a carrier frame, wherein contacts of the I/O adapter card connect to a first connector of the carrier frame; and inserting the assembly into a host system along a second direction, wherein a second connector of the carrier frame connects to the host system and the second connector is coupled to the first connector, wherein the second direction is toward an interior portion of the host system and is oriented approximately normal to the first direction.

Forming the assembly of an embodiment comprises orienting the first connector horizontally so the I/O adapter card has a flat orientation relative to the carrier frame when the I/O adapter card is connected to the first connector.

The method of an embodiment comprises coupling the second connector to the first connector using traces of a circuit board mounted to the carrier frame.

The method of an embodiment comprises conditioning signals transferred between the first connector and the second connector.

The method of an embodiment comprises providing a visual indication of at least one of a power state and an operational status of the I/O adapter card.

The visual indication of an embodiment faces in a direction external to the host system.

The inserting of the assembly of an embodiment into the host system is performed while the host system is operating.

The method of an embodiment comprises removing the assembly from the host system by sliding the assembly along the second direction.

The removing of the assembly of an embodiment from the host system is performed while the host system is operating.

The embodiments described herein include a method comprising: forming an assembly by inserting an input/output (I/O) adapter card into a first side of a carrier frame, wherein contacts of the I/O adapter card connect to a second connector of on a second side of the carrier frame, wherein the second side is approximately parallel to the first side, wherein a moveable portion of the first side secures the I/O adapter card in the carrier frame; and inserting the assembly into a host system, wherein a third connector on the third side of the carrier frame connects to the host system, wherein the third side of the carrier frame is approximately perpendicular to the first side and the second side.

The embodiments described herein include a system comprising: a chassis having an opening on a side; a riser board perpendicularly mounted to the chassis and including a straight connector for receiving an adapter card carrier; and a carrier housing having a rectangular shape including a front side, a back side, and two parallel sidewalls, wherein the front side includes an opening for accepting the adapter card carrier, wherein each of the two parallel sidewalls includes a flange for mechanically coupling the carrier housing to the chassis and a guide rail to horizontally receive the adapter card carrier, wherein the opening receives the carrier housing including the adapter card carrier and the adapter card carrier connects to the straight connector.

The riser board of an embodiment is a mid-plane riser board positioned in a middle region of the chassis.

The mid-plane riser board of an embodiment includes a second straight connector, the second straight connector receiving a motherboard.

A first side of the mid-plane riser board of an embodiment includes the straight connector.

The first side of the mid-plane riser board of an embodiment includes the second straight connector.

A second side of the mid-plane riser board of an embodiment includes the second straight connector.

The riser board of an embodiment is a back-plane riser board positioned in an end region of the chassis, the end region opposite the opening.

A first side of the back-plane riser board of an embodiment includes the straight connector.

The back-plane riser board of an embodiment includes a second straight connector, the second straight connector receiving a motherboard.

The carrier housing of an embodiment has a horizontal orientation relative to a bottom of the chassis when the adapter card carrier in the carrier housing is connected to the straight connector.

The carrier housing of an embodiment has a vertical orientation relative to a bottom of the chassis when the adapter card carrier in the carrier housing is connected to the straight connector.

The riser board of an embodiment includes a third straight connector, wherein the third straight connector receives a second adapter card carrier.

The carrier housing of an embodiment accepts two adapter card carriers.

The riser board of an embodiment comprises a plurality of straight connectors.

The system of an embodiment comprises a plurality of carrier housings and a plurality of adapter card carriers, wherein each carrier housing accepts two adapter card carriers, wherein the opening receives the plurality of carrier housings including the plurality of adapter card carriers, and the plurality of adapter card carriers couple to the plurality of straight connectors.

The adapter card carrier of an embodiment comprises: a carrier frame; a first connector on a first side of the carrier frame, the first connector connecting to the straight connector when the carrier frame is inserted into the carrier housing; and a second connector on a second side of the carrier frame, the second side of the carrier frame perpendicular to the first side, the second connector electrically coupled to the first connector and connecting to an adapter card inserted into a third side of the carrier frame, the third side perpendicular to the first side.

The second connector of an embodiment is horizontally positioned so the adapter card has a flat orientation relative to the carrier frame when the adapter card is connected to the second connector.

The carrier frame of an embodiment is inserted into the carrier housing along a first direction, the first direction toward an interior portion of the carrier housing, wherein the adapter card is inserted into the carrier frame along a second direction, the second direction oriented approximately normal to the first direction.

The system of an embodiment comprises a circuit board mounted to the carrier frame, wherein the first connector and the second connector are mounted to the circuit board.

The adapter card carrier of an embodiment is formed by the circuit board mounted on the carrier frame and the adapter card secured into the carrier frame.

The system of an embodiment comprises a signal conditioner circuit coupled between the first connector and the second connector.

The system of an embodiment comprises a circuit board mounted to the carrier frame, wherein the signal conditioner circuit is an application-specific integrated circuit on the circuit board.

The system of an embodiment comprises at least one visual indicator configured to indicate a power state and an operational status of the adapter card.

The at least one visual indicator of an embodiment faces in a direction external to the host system.

The at least one visual indicator of an embodiment is one of a uni-color light emitting diode (LED), a bi-color LED, and a tri-color LED.

The system of an embodiment comprises a circuit board mounted to the carrier frame, wherein the at least one visual indicator is carried on the circuit board.

The system of an embodiment comprises a switch adapted for hot-swapping the adapter card, wherein hot-swapping comprises at least one of inserting and removing the adapter card while the host system is operating.

The switch of an embodiment faces in a direction external to the host system.

The third side of the carrier frame of an embodiment is coupled to the first side with a hinge, wherein the third side is placed in an open position by rotating the third side around the hinge.

The system of an embodiment comprises a latch that secures the third side of the carrier frame in a closed position, wherein the closed position secures the adapter card in the carrier frame.

The adapter card of an embodiment is compliant to a standard form factor specified by PCI-SIG.

The carrier housing of an embodiment is mounted in one of a 1 U system chassis, a 4 U system chassis, and a 5 U system chassis.

The embodiments described herein include a system comprising: a chassis; a riser board perpendicularly mounted to the chassis and including at least one straight connector for receiving at least one adapter card carrier; and a carrier housing having a rectangular shape including a front side, a back side, and two parallel sidewalls, wherein the front side includes an opening for accepting the adapter card carrier, wherein each of the two parallel sidewalls includes a flange disposed outwardly at the bottom for mechanically coupling the carrier housing to the chassis, and a guide rail configured to horizontally receive the adapter card carrier, wherein the back side includes an opening providing access to the straight connector.

The adapter card carrier of an embodiment comprises: a carrier frame; a first connector on a first side of the carrier frame, the first connector connecting to the at least one straight connector when the carrier frame is inserted into the carrier housing; and a second connector on a second side of the carrier frame, the second side of the carrier frame perpendicular to the first side, the second connector electrically coupled to the first connector and connecting to an adapter card inserted into a third side of the carrier frame, the third side perpendicular to the first side.

The system of an embodiment comprises a plurality of carrier housings, wherein each carrier housing includes a plurality of adapter card carriers, wherein each adapter card carrier includes at least one adapter card that couples to the at least one straight connector.

The plurality of carrier housings of an embodiment has a horizontal orientation relative to the chassis.

The plurality of carrier housings of an embodiment has a vertical orientation relative to the chassis.

The embodiments described herein include a method comprising: forming an adapter card carrier by inserting an adapter card along a first direction into a carrier frame, wherein contacts of the adapter card connect to a first connector of the carrier frame; and inserting the adapter card carrier into a carrier housing of a host system along a second direction, wherein a second connector of the carrier frame connects to a straight connector of a riser board mounted to a chassis of the host system, wherein the second connector is coupled to the first connector, wherein the second direction is toward an interior portion of the host system and is oriented approximately normal to the first direction.

The method of an embodiment comprises forming the carrier housing to have a rectangular shape including a front side, a back side, and two parallel sidewalls, wherein the front side includes an opening for accepting the adapter card carrier, wherein each of the two parallel sidewalls includes a flange for mechanically coupling the carrier housing to the chassis and a guide rail to horizontally receive the adapter card carrier.

The method of an embodiment comprises forming the back side to include an opening providing access to the at least one straight connector of the riser board.

The method of an embodiment comprises forming the carrier housing to accept two adapter card carriers positioned horizontally adjacent each other.

The method of an embodiment comprises forming the first side of the riser board to include a second straight connector for receiving a second adapter card carrier.

Forming the adapter card carrier of an embodiment comprises orienting the first connector horizontally so the adapter card has a flat orientation relative to the carrier frame when the adapter card is connected to the first connector.

The method of an embodiment comprises coupling the second connector to the first connector using traces of a circuit board mounted to the carrier frame.

The method of an embodiment comprises conditioning signals transferred between the first connector and the second connector.

The method of an embodiment comprises providing a visual indication of at least one of a power state and an operational status of the adapter card.

The visual indication of an embodiment faces in a direction external to the host system.

The inserting of the adapter card carrier of an embodiment into the host system is performed while the host system is operating.

The method of an embodiment comprises removing the adapter card carrier from the host system by sliding the adapter card carrier along the second direction.

The removing of the adapter card carrier of an embodiment from the host system is performed while the host system is operating.

The method of an embodiment comprises inserting the carrier housing into a chassis of the host system such that the second connector of the carrier frame connects to the straight connector of the riser board.

The method of an embodiment comprises positioning the riser board so a first side of the riser board faces the carrier housing and a second side of riser board faces a motherboard of the host system.

The method of an embodiment comprises positioning the riser board so a first side of the riser board faces the carrier housing and a motherboard of the host system.

The method of an embodiment comprises orienting the carrier housing horizontally relative to a bottom of the chassis when the adapter card carrier in the carrier housing is connected to the straight connector.

The method of an embodiment comprises orienting the carrier housing vertically relative to a bottom of the chassis when the adapter card carrier in the carrier housing is connected to the straight connector.

The method of an embodiment comprises inserting a plurality of carrier housings into the chassis, wherein each carrier housing includes a plurality of adapter card carriers, wherein each adapter card carrier includes at least one adapter card that couples to at least one straight connector of the riser board.

One or more components of the embodiments herein and/or a corresponding system or application to which the embodiments are coupled or connected include and/or run under and/or in association with a processing system. The processing system includes any collection of processor-based devices or computing devices operating together, or components of processing systems or devices, as is known in the art. For example, the processing system can include one or more of a portable computer, portable communication device operating in a communication network, and/or a network server. The portable computer can be any of a number and/or combination of devices selected from among personal computers, personal digital assistants, portable computing devices, and portable communication devices, but is not so limited. The processing system can include components within a larger computer system.

The processing system of an embodiment includes at least one processor and at least one memory device or subsystem. The processing system can also include or be coupled to at least one database. The term "processor" as generally used herein refers to any logic processing unit, such as one or more central processing units (CPUs), digital signal processors (DSPs), application-specific integrated circuits (ASIC), etc. The processor and memory can be monolithically integrated onto a single chip, distributed among a number of chips or components, and/or provided by some combination of algorithms. The methods described herein can be implemented in one or more of software algorithm(s), programs, firmware, hardware, components, circuitry, in any combination.

The components of any system that includes the embodiments can be located together or in separate locations. Communication paths couple the components and include any medium for communicating or transferring files among the components. The communication paths include wireless connections, wired connections, and hybrid wireless/wired connections. The communication paths also include couplings or connections to networks including local area networks (LANs), metropolitan area networks (MANs), wide area networks (WANs), proprietary networks, interoffice or backend networks, and the Internet. Furthermore, the communication paths include removable fixed mediums like floppy disks, hard disk drives, and CD-ROM disks, as well as flash RAM, Universal Serial Bus (USB) connections, RS-232 connections, telephone lines, buses, and electronic mail messages.

Aspects of the embodiments and corresponding systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the embodiments and corresponding systems and methods include: microcontrollers with memory (such as electronically erasable programmable read only memory (EEPROM)), embedded microprocessors, firmware, software, etc. Furthermore, aspects of the embodiments and corresponding systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that any system, method, and/or other components disclosed herein may be described using computer aided design tools and expressed (or represented), as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments of the embodiments and corresponding systems and methods is not intended to be exhaustive or to limit the systems and methods to the precise forms disclosed. While specific embodiments of, and examples for, the embodiments and corresponding systems and methods are described herein for illustrative purposes, various equivalent modifications are possible within the scope of the systems and methods, as those skilled in the relevant art will recognize. The teachings of the embodiments and corresponding systems and methods provided herein can be applied to other systems and methods, not only for the systems and methods described above.

The elements and acts of the various embodiments described above can be combined to provide further embodiments. These and other changes can be made to the embodiments and corresponding systems and methods in light of the above detailed description.

In general, in the following claims, the terms used should not be construed to limit the embodiments and corresponding systems and methods to the specific embodiments disclosed in the specification and the claims, but should be construed to include all systems that operate under the claims. Accordingly, the embodiments and corresponding systems and methods is not limited by the disclosure, but instead the scope is to be determined entirely by the claims.

While certain aspects of the embodiments and corresponding systems and methods are presented below in certain claim forms, the inventors contemplate the various aspects of the embodiments and corresponding systems and methods in any number of claim forms. Accordingly, the inventors reserve the right to add additional claims after filing the application to pursue such additional claim forms for other aspects of the embodiments and corresponding systems and methods.

What is claimed is:

1. A device comprising: a card carrier comprising a substantially L-shaped PCB attached to a substantially U-shaped carrier frame thereby forming a substantially U-shaped recess; a first connector disposed on an outer edge of a first side of the L-shaped PCB for connecting to a host system connector when the card carrier is inserted into the host system;

a second connector disposed on an inner edge of a second side of the L-shaped PCB, the second side of the L-shaped PCB perpendicular to the first side, the second connector electrically coupled to the first connector;

and the card carrier further comprising a carrier frame lid that is rotatably coupled to the card carrier, the carrier frame lid configured to rotate to an open position and facilitate insertion of an adapter card into the U-shaped recess co-planar with the L-shaped PCB and facilitate connection of the inserted adapter card with the second connector, the carrier frame lid further configured to rotate to a closed position across the U-shaped recess and adjacent to the inserted adapter card along an entire length of an outer edge thereof; wherein the second connector is horizontally positioned so the inserted adapter card has a flat orientation relative to the card carrier when connected to the second connector; and wherein the card carrier is inserted into the host system along a first direction, the first direction toward an interior portion of the host processing system, wherein the adapter card is inserted into the card carrier along a second direction, the second direction oriented approximately normal to the first direction.

2. The device of claim 1, wherein the L-shaped PCB includes a structure comprising at least one of isolation layers and conductive layers.

3. The device of claim 1, wherein the card carrier is slidingly insertable and removable from the host system.

4. The device of claim 1, comprising a signal conditioner circuit coupled between the first connector and the second connector.

5. The device of claim 4, wherein the signal conditioner circuit is an application-specific integrated circuit on the L-shaped PCB.

6. The device of claim 1, comprising at least one visual indicator configured to indicate a power state and an operational status of the inserted adapter card.

7. The device of claim 6, wherein the at least one visual indicator faces in a direction external to the host system.

8. The device of claim 6, wherein the at least one visual indicator is one of a uni-color light emitting diode (LED), a bi-color LED, and a tri-color LED.

9. The device of claim 6, wherein the at least one visual indicator is carried on the L shaped PCB.

10. The device of claim 1, comprising a switch adapted for hot-swapping the adapter card, wherein hot-swapping comprises at least one of inserting and removing the adapter card while the host system is operating.

11. The device of claim 10, wherein the switch faces in a direction external to the host system.

12. The device of claim 1, comprising a latch that secures the carrier frame lid in the closed position, wherein the closed position secures the inserted adapter card within the card carrier.

13. The device of claim 1, wherein the card carrier is compliant to a standard form factor specified by PCI-SIG.

14. A method comprising: providing a card carrier comprising a substantially U-shaped recess formed by attaching a substantially L-shaped PCB to a substantially U-shaped carrier frame, the card carrier further comprising a first connector disposed on an outer edge of a first side of the L-shaped PCB and a second connector disposed on an inner edge of a second side of the L-shaped PCB, the second side of the L-shaped PCB perpendicular to the first side, the second connector electrically coupled to the first connector; and the card carrier further comprising a carrier frame lid that is rotatably coupled to the card carrier, the carrier frame lid configured to rotate to an open position and facilitate insertion of an adapter card into the U-shaped recess co-planar with the L-shaped PCB and facilitate connection of the inserted adapter card with the second connector, the carrier frame lid further configured to rotate to a closed position across the U-shaped recess and adjacent to the inserted adapter card along an entire length of an outer edge thereof; wherein the second connector is horizontally positioned so the inserted adapter card has a flat orientation relative to the card carrier when connected to the second connector; inserting the card carrier into the host system along a first direction, the first direction toward an interior portion of the host processing system, inserting the adapter card into the card carrier along a second direction, the second direction oriented approximately normal to the first direction.

15. A system comprising: a host comprising a host connector; a card carrier comprising a substantially L-shaped PCB attached to a substantially U-shaped carrier frame thereby forming a substantially U-shaped recess; a first connector disposed on an outer edge of a first side of the L-shaped PCB, the first connector configured to connect to the host connector when the card carrier is inserted into the host; and a second connector disposed on an inner edge of a second side of the L-shaped PCB, the second side of the L-shaped PCB perpendicular to the first side, the second connector electrically coupled to the first connector; and the card carrier further comprising a carrier frame lid that is rotatably coupled to the card carrier, the carrier frame lid configured to rotate to an open position and facilitate insertion of an adapter card into the U-shaped recess co-planar with the L-shaped PCB and facilitate connection of the inserted adapter card with the second connector, the carrier frame lid further configured to rotate to a closed position across the U-shaped recess and adjacent to the inserted adapter card along an entire length of an outer edge thereof; wherein the second connector is horizontally positioned so the inserted adapter card has a flat orientation relative to the card carrier when connected to the second connector; and wherein the card carrier is inserted into the host system along a first direction, the first direction toward an interior portion of the host processing system, wherein the adapter card is inserted into the card carrier along a second direction, the second direction oriented approximately normal to the first direction.

* * * * *